United States Patent [19]
Hartner et al.

[11] Patent Number: 6,043,529
[45] Date of Patent: Mar. 28, 2000

[54] SEMICONDUCTOR CONFIGURATION WITH A PROTECTED BARRIER FOR A STACKED CELL

[75] Inventors: Walter Hartner; Günther Schindler, both of München; Carlos Mazure-Espejo, Zorneding, all of Germany

[73] Assignee: Siemens Aktiengesellschaft, Munich, Germany

[21] Appl. No.: 09/282,099

[22] Filed: Mar. 30, 1999

Related U.S. Application Data

[63] Continuation of application No. PCT/DE97/02133, Sep. 19, 1997.

[30] Foreign Application Priority Data

Sep. 30, 1996 [DE] Germany .................. 196 40 246

[51] Int. Cl.[7] ............................................. H01L 29/78
[52] U.S. Cl. ..................... 257/306; 257/295; 257/308; 257/310
[58] Field of Search ....................... 257/306, 295, 257/310, 532, 308

[56] References Cited

U.S. PATENT DOCUMENTS

| | | | |
|---|---|---|---|
| 3,979,237 | 9/1976 | Morcom et al. | 156/3 |
| 5,366,920 | 11/1994 | Yamamichi et al. | 257/306 |
| 5,418,388 | 5/1995 | Okudaira et al. | 257/295 |
| 5,459,345 | 10/1995 | Okudaira et al. | 257/310 |
| 5,464,786 | 11/1995 | Figura et al. | 257/306 |
| 5,506,166 | 4/1996 | Sandhu et al. | 257/306 |
| 5,717,236 | 2/1998 | Shinkawata | 257/306 |
| 5,739,563 | 4/1998 | Kawakubo et al. | 257/295 |
| 5,852,307 | 12/1998 | Aoyama et al. | 257/295 |
| 5,923,062 | 7/1999 | Ohno | 257/310 |

*Primary Examiner*—Donald L. Monin, Jr.
*Attorney, Agent, or Firm*—Herbert L. Lerner; Laurence A. Greenberg; Werner H. Stemer

[57] ABSTRACT

The invention relates to a semiconductor configuration for integrated circuits, in which a stacked cell has a contact hole filled with a plug in an insulating layer, a capacitor having a lower electrode, which faces the plug, a paraelectric or ferroelectric dielectric and an upper electrode being provided on the contact hole. A barrier layer is situated between the plug and the lower electrode and is surrounded by a silicon nitride collar, which reliably prevents oxidation of the barrier layer.

7 Claims, 3 Drawing Sheets

SEMICONDUCTOR CONFIGURATION WITH A PROTECTED BARRIER FOR A STACKED CELL

CROSS-REFERENCE TO RELATED APPLICATION

This is a continuation of copending International Application PCT/DE97/02133, filed Sep. 19, 1997, which designated the United States.

BACKGROUND OF THE INVENTION

Field of the Invention

The present invention relates in general to the field of semiconductors, and specifically to a semiconductor configuration and a method for fabricating a semiconductor configuration including a stacked cell with a protected barrier.

Conventional storage elements of semiconductor memory configurations usually use, as the storage dielectric, silicon dioxide or silicon nitride layers, although both of these have a dielectric constant in the region of merely about 6. A higher dielectric constant, however, would lead to a larger capacitance of the corresponding capacitor, so that the dimensions of the capacitor could actually be reduced if a corresponding increase in the capacitance is dispensed with.

In other words, the use of a dielectric having a large dielectric constant leads to a reduction in the area required for a capacitor with a corresponding capacitance, and thus to an increase in the integration level.

The developments practiced in this connection have yielded materials having a dielectric constant considerably higher than 6. Thus, an example of a paraelectric material that has been developed is $(Ba_xST_{1-x})TiO_3$, "BST", which has a dielectric constant of the order of magnitude of 400. It is obvious that BST permits a considerable increase in the integration level when it is used instead of the customary silicon dioxide or silicon nitride layers.

Furthermore, conventional storage elements, such as, for example, a dynamic random memory (DRAM), use paraelectric materials, although these lose their charge, and consequently also the information stored with the charge, in the event of a supply voltage failure. Because of the leakage current that occurs in conventional storage elements of this type, the charge must be continually "refreshed" or rewritten to. The use of novel ferroelectric materials as a storage dielectric is desirable since this enables the fabrication of nonvolatile semiconductor memory configurations that do not lose their information in the event of a supply voltage failure and, in addition, do not have to be continually refreshed.

To summarize, the use of ferroelectric materials as a storage dielectric is intrinsically desirable in the case of semiconductor memory configurations, since it is then possible to achieve an increase in the integration level in conjunction with protection in respect to a supply voltage failure.

However, the practical realization of the use of such ferroelectric or else paraelectric materials in semiconductor memory configurations depends to a great extent on how these materials can be incorporated in an integrated semiconductor circuit configuration. Such ferroelectric or paraelectric materials that have been taken into consideration heretofore are, in addition to the BST already mentioned, $(Pb,Zr)TiO_3$ (PZT), $SrBi_2Ta_2O_9$ (SBT), $SrBi_2(Ta,Nb)O_9$ (SBTN) $SrTiO_3$ (ST), ferroelectric and paraelectric polymers, etc. and generally ferroelectric and paraelectric materials.

Although these materials have high dielectric constants, and for this reason, are already used in ferroelectric random memories (FeRAM), their importance is still limited in practice. This is because it has been shown that the materials having a high dielectric constant cannot readily be used in semiconductor memory configurations. For example, the application of dielectric materials having a high dielectric constant or of ferroelectrics in large scale integrated stacked cells of semiconductor memory configurations is greatly impeded by the fact that the so-called "plug" or the filler material introduced into a contact hole is oxidized upon deposition of the dielectric. This oxidation takes place specifically because dielectrics having a high dielectric constant and ferroelectrics involve oxides which have to be exposed to high temperatures in an oxygen-containing atmosphere during the fabrication of the semiconductor or capacitor configuration.

Since the platinum electrode that is usually used for the capacitor contact is oxygen-permeable, the interface between the plug and the electrode, for example, oxidizes, which creates an electrical interruption.

FIG. 3 shows such a semiconductor configuration with a memory cell. In this semiconductor configuration, a dielectric insulator layer 2 made of silicon dioxide, for example, is applied to a semiconductor body 10 having a heavily doped region 9, and a hole 8 etched into the insulator layer. This hole 8 is filled with a filler material or plug 1 made from tungsten or polycrystalline silicon. Provided above the plug 1 is a barrier layer 3, which is made from, for example, WN, TiWN, TaN, WC, etc. The barrier layer 3 separates a lower electrode 5 made of platinum from the plug 1. A paraelectric or ferroelectric dielectric 6 is situated on the lower electrode 5, and an upper electrode 7 is applied in turn to the dielectric. In this semiconductor configuration, the barrier layer 3 is oxidized, beginning in the region 11, and this can ultimately lead to an electrical interruption. The oxidation advances from the region 11 along the interface 14 between the barrier layer 3 and the electrode 5 and along the interface 15 between the barrier layer 3 and the insulation layer 2.

This is a major reason that, in practice, the integration of a ferroelectric or paraelectric dielectric in a memory configuration in conjunction with a high integration level has been regarded heretofore as having little promise of success.

In an attempt to avoid significant oxidation of the interface between electrode and the plug, dielectrics having a high dielectric constant or ferroelectrics have previously been deposited in planar fashion above a LOCOS region only after the completion of a conventional CMOS transistor structure. In other words, besides a MOS transistor whose drain is connected, for example, to a bit line and whose gate is connected to a word line, a capacitor is provided above the LOCOS region. The upper electrode of the capacitor is made from platinum, for example, and is connected to the source electrode of a MOS transistor. The insulating layer of the capacitor is fabricated from a ferroelectric, and the second electrode (common plate), which is situated on a side of the ferroelectric opposite from the first electrode, is likewise fabricated from platinum, for example. SBT can be used as the dielectric. The sizes of the memory cells formed in this way are, for example, $10.1\ \mu m \times 16.5\ \mu m = 167\ \mu m^2 = 46\ F^2$, if a basic dimension of $1.9\ \mu m$ is used for F. In this case, the area of the capacitor is about $3.3\ \mu m \times 3.3\ \mu m = 10.9\ \mu m^2 = 3\ F^2$. In other words, there is a relatively large space requirement for the memory cell and/or the interconnection thereof to the capacitor.

The application of a capacitor above the LOCOS region has the advantage, however, that a sputtering or sol gel method can be used for fabricating the planar ferroelectric layer of the capacitor. In particular as a result of the application of the ferroelectric layer, which takes place in a greatly oxidizing environment, the diffusion of oxygen through the electrode, which is usually made from platinum, no longer impairs the layer situated underneath, since an oxide is already present there.

To summarize, although the deposition of a CMOS transistor structure above the LOCOS region is readily possible, it leads to a considerable reduction in the integration level.

Although it is possible for the ferroelectric layers to be applied directly above the electrically conductive plug, this leads to further oxidation and thus ultimately to insulation of the electrical connections.

SUMMARY OF THE INVENTION

It is accordingly an object of the present invention to provide a semiconductor configuration that permits integration of components with ferroelectric and paraelectric materials and in which undesirable oxidation in the region of the barrier layer of the plug is reliably avoided. In addition, a method for fabricating the semiconductor configuration is provided.

With the foregoing and other objects in view there is provided, in accordance with the invention, a semiconductor configuration for an integrated circuit, comprising:

a capacitor including a lower and an upper electrode, and a dielectric selected from the group consisting of a superparaelectric, a paraelectric, and a ferroelectric material disposed between the lower and upper electrodes;

an insulating layer formed with a contact hole therethrough;

a filler material disposed in the contact hole;

a barrier layer having a top surface, the barrier layer being disposed in the contact hole and disposed directly on the filler material, the barrier layer disposed between and electrically connecting the filler material and the lower electrode of the capacitor; and a silicon nitride layer having a top surface, the silicon nitride layer being disposed on the insulating layer and laterally surrounding the barrier layer;

the top surface of the barrier layer and the top surface of the silicon nitride layer substantially forming a plane with the capacitor disposed thereon.

In accordance with an added feature of the invention, the filler material is a conductive material selected from the group consisting of silicides, nitrides, tungsten and polycrystalline silicon.

In accordance with an additional feature of the invention, at least one of the lower electrode and the upper electrode is a conductive material selected from the group consisting of platinum, ruthenium, iridium, palladium and conductive oxides thereof.

In accordance with an another feature of the invention, the barrier layer is a material selected from the group consisting of WN, WC, WTiN, TaN, TiN and TiC.

With the objects of the invention in view, there is also provided a method for fabricating a semiconductor configuration for an integrated circuit, which comprises:

fabricating a CMOS plane with a semiconductor body;

producing an insulating layer;

applying a thickness of a silicon nitride layer on the insulating layer;

forming a contact hole in the insulating layer and in the silicon nitride layer;

filling the contact hole with a conductive filler material selected from the group consisting of silicides, nitrides, tungsten and polycrystalline silicon;

producing a recess in the conductive filler material having a depth corresponding to the thickness of the silicon nitride layer;

producing a barrier layer in the recess;

producing a surface of the barrier layer that is substantially aligned with a surface of the silicon nitride layer by performing an alignment step selected from the group consisting of grinding and etching-back;

applying a lower electrode to the surface of the barrier layer;

selecting a dielectric from the group consisting of a superparaelectric, a paraelectric, and a ferroelectric material;

applying a layer made from the dielectric onto the lower electrode; and applying an upper electrode onto the dielectric layer.

In accordance with a concomitant feature of the invention, before the step of filling the contact hole, a silicon nitride layer is deposited on a wall of the contact hole.

In the case of the semiconductor configuration according to the invention, the barrier layer is embedded in a "silicon nitride collar" formed by a silicon nitride layer. As a result, the material of the barrier layer, that is to say, for example, titanium nitride, tungsten nitride, titanium tungsten nitride, tantalum nitride, etc., is reliably protected against oxidation.

The "silicon nitride collar" prevents the lateral diffusion of oxygen during the fabrication of the paraelectric or ferroelectric dielectric. In other words, lateral oxidation of the barrier layer, as is the case in the prior art, practically does not occur. An additional effect that is achieved is that the material, e.g. platinum, of the lower electrode adheres well on the silicon nitride layer.

Other features which are considered as characteristic for the invention are set forth in the appended claims.

Although the invention is illustrated and described herein as embodied in a semiconductor configuration with a protected barrier for a stacked cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
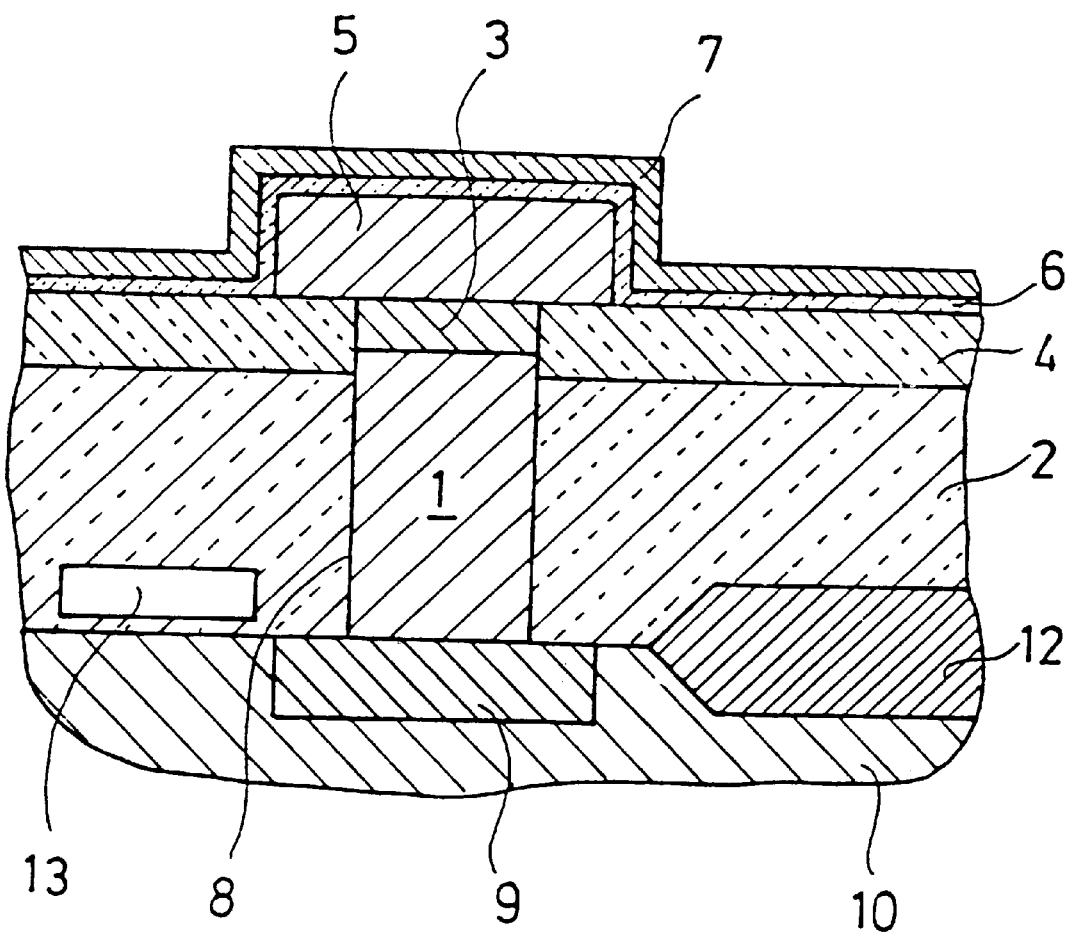
FIG. 1 is a section through a first exemplary embodiment of the semiconductor configuration according to the invention.

Mutually corresponding structural parts are in each case provided with the same reference symbols in the figures. FIG. 1 shows a first exemplary embodiment of a semiconductor configuration. A silicon dioxide layer 2 is situated on a silicon substrate 10 having a heavily doped region 9. The silicon dioxide layer has a contact hole 8 to the heavily doped region 9. Further conductive or heavily doped regions 13 and insulation regions 12 can additionally be provided in the silicon dioxide layer 2 and/or on the silicon substrate 10. These regions 13, 12 may be interconnects or LOCOS, for example.

The contact hole 8 is provided with filling material or a plug 1. A barrier layer 3 is arranged between the plug 1 made from a conductive material, for example, tungsten, silicon, nitrides or polycrystalline silicon, and a lower electrode 5 made from for example, platinum. The barrier layer 3 may be fabricated from conductive nitrides, carbides, borides, etc., such as, for example, WN, WC, WTiN, TaN, TiN, TiC, etc. One possible material for the plug 1 is WSi. The barrier layer 3 is surrounded laterally by a silicon nitride layer 4, the top side of which lies in the same plane as the top side of the barrier layer 3. However, the top side of the barrier layer 3 may also lie somewhat below the top side of the silicon nitride layer 4. A paraelectric, superparaelectric or ferroelectric dielectric 6 is applied to the lower electrode 5 made of platinum, which dielectric is in turn covered with an upper electrode 7. The upper electrode 7 and/or the lower electrode 5 may also be made from ruthenium, iridium, palladium or conductive oxides thereof, such as $RuO_2$, $IrO_2$, etc.

The semiconductor configuration according to the invention may be fabricated in the following manner. First of all, the CMOS plane with the semiconductor body 10, the heavily doped regions 9 and 13, the insulation region 12 and the silicon dioxide layer 2 are fabricated. The silicon nitride layer 4 is then deposited before the contact hole 8 is etched.

After the contact hole 8 has been etched and filled with tungsten, conductive material such as silicides or polycrystalline silicone, etching-back is carried out in order to form a recess in the upper region of the plug 1. The depth of the etching-back is matched approximately to the thickness of the silicon nitride layer 4 in such a way that it is somewhat less than the thickness of the silicon nitride layer 4. The barrier layer 3 is then applied in the region of etching-back by means of sputtering or MOCVD. The surface of the barrier layer 3 is aligned with the surface of the silicon nitride layer 4 by means of, for example, an etching-back or a grinding process. In other words, the silicon nitride layer 4 surrounds the barrier layer 3 like a "collar".

The lower electrode 5, which is preferably made from platinum, is applied to the barrier layer 3. The paraelectric, superparaelectric or ferroelectric dielectric 6 is then applied and structured. During the deposition of the dielectric 6 and also during the subsequent oxidizing heat-treatment processes, the barrier layer 3 acts as protection against indiffusing oxygen and prevents oxidation of the plug 1. At the same time, the silicon nitride layer 4 reliably protects the embedded barrier layer 3 against oxidation and ensures the integrity of the platinum/barrier layer/plug structure. As is known, silicon nitride is a good oxygen diffusion barrier, which, in the present case, prevents oxygen from being fed to the junction region between the barrier layer 3 and the lower electrode 5 from the surroundings.

The present invention thus increases the oxidation resistance of the barrier layer 3 to a great extent.

Figure 2:
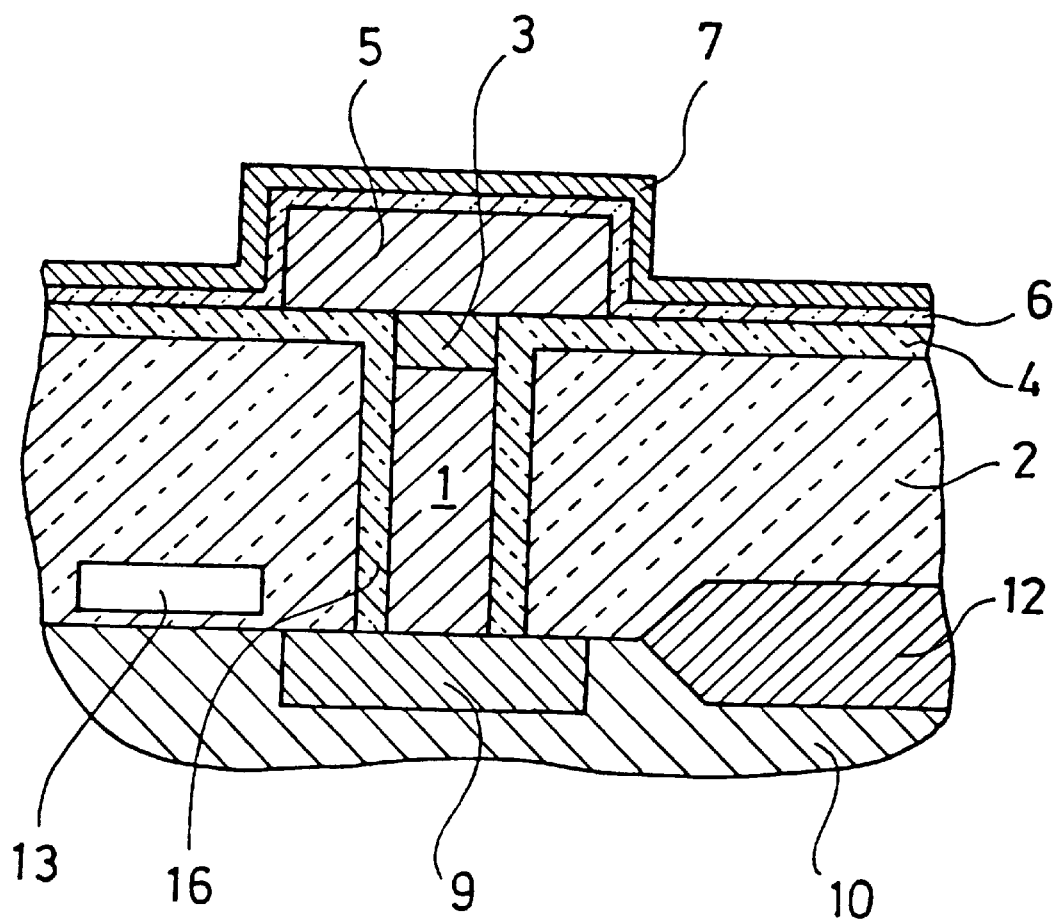
FIG. 2 is a section through a second exemplary embodiment of the semiconductor configuration according to the invention.
Figure 3:
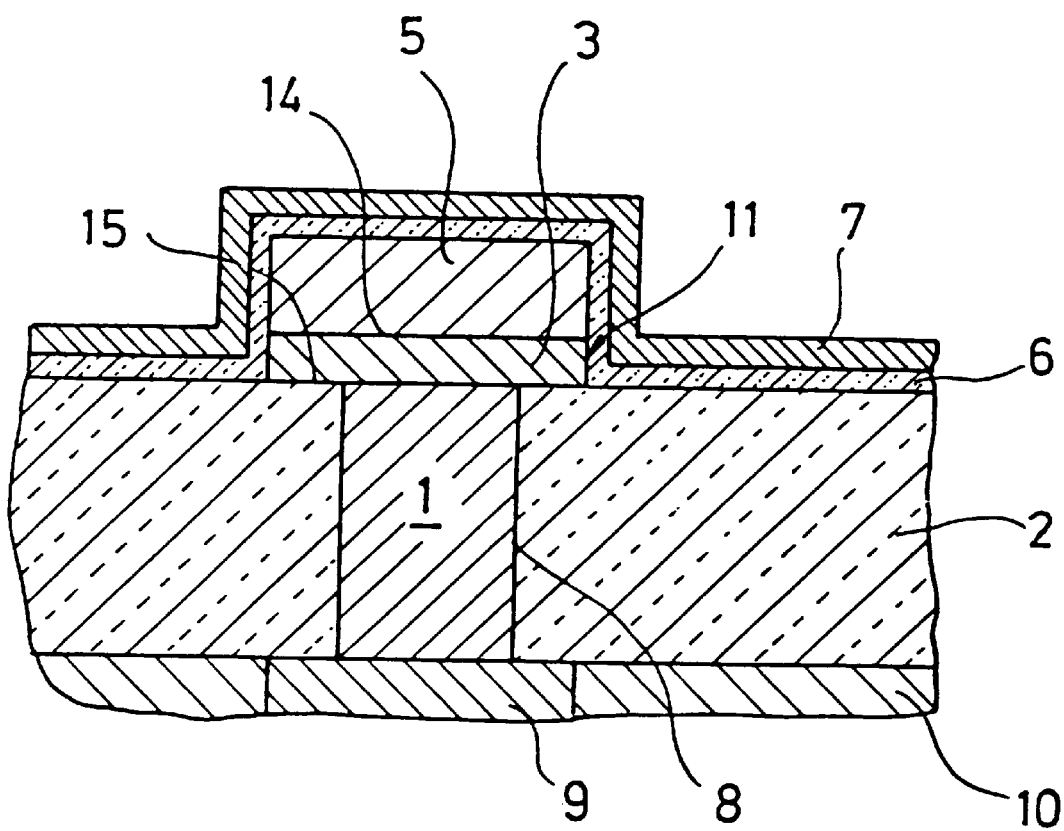
FIG. 3 is a section through a prior art semiconductor configuration.

FIG. 2 shows a further exemplary embodiment of the invention. In this exemplary embodiment, the wall of the contact hole 8 is covered with an additional silicon nitride layer 16, which is deposited after the contact hole 8 has been etched.

We claim:

1. A semiconductor configuration for an integrated circuit, comprising:

a capacitor including a lower and an upper electrode, and a dielectric selected from the group consisting of a superparaelectric, a paraelectric, and a ferroelectric material disposed between said lower and upper electrodes;

an insulating layer formed with a contact hole therethrough;

a filler material disposed in said contact hole;

a silicon nitride layer disposed on a wall of said contact hole;

a barrier layer having a top surface, said barrier layer being disposed in said contact hole and disposed directly on said filler material, said barrier layer disposed between and electrically connecting said filler material and said lower electrode of said capacitor; and a silicon nitride layer having a top surface, said silicon nitride layer being disposed on said insulating layer and laterally surrounding said barrier layer;

said top surface of said barrier layer and said top surface of said silicon nitride layer substantially forming a plane with said capacitor disposed thereon.

2. The semiconductor configuration according to claim 1, wherein said filler material is a conductive material selected from the group consisting of silicides, nitrides, tungsten, polycrystalline silicon, and tungsten silicide.

3. The semiconductor configuration according to claim 2, wherein at least one of said lower electrode and said upper electrode is a conductive material selected from the group consisting of platinum, ruthenium, iridium, palladium and conductive oxides thereof.

4. The semiconductor configuration according to claim 1, wherein at least one of said lower electrode and said upper electrode is a conductive material selected from the group consisting of platinum, ruthenium, iridium, palladium and conductive oxides thereof.

5. The semiconductor configuration according to claim 1, wherein said barrier layer is a material selected from the group consisting of WN, WC, WTiN, TaN, TiN and TiC.

6. A method for fabricating a semiconductor configuration for an integrated circuit, which comprises:

fabricating a CMOS plane with a semiconductor body;

producing an insulating layer;

applying a thickness of a silicon nitride layer on the insulating layer;

forming a contact hole in the insulating layer and in the silicon nitride layer;

depositing a silicon nitride layer on a wall of the contact hole;

filling the contact hole with a conductive filler material selected from the group consisting of silicides, nitrides, tungsten and polycrystalline silicon;

producing a recess in the conductive filler material having a depth corresponding to the thickness of the silicon nitride layer;

producing a barrier layer in the recess;

producing a surface of the barrier layer that is substantially aligned with a surface of the silicon nitride layer by performing an alignment step selected from the group consisting of grinding and etching-back;

applying a lower electrode to the surface of the barrier layer;

selecting a dielectric from the group consisting of a superparaelectric, a paraelectric, and a ferroelectric material;

applying a layer made from the dielectric onto the lower electrode; and applying an upper electrode onto the dielectric layer.

7. The method according to claim 6, which comprises:

aligning the top surface of the barrier layer with the top surface of the silicon nitride layer and planarising the barrier layer and the silicon nitride layer to one another.

* * * * *